(12) United States Patent
Cooper

(10) Patent No.: US 6,724,640 B1
(45) Date of Patent: Apr. 20, 2004

(54) BLADE ARMOR SHIELDING

(76) Inventor: Steve Cooper, 735 S. Vinewood St., Escondido, CA (US) 92029

(*) Notice: Subject to any disclaimer, the term of this patent is extended or adjusted under 35 U.S.C. 154(b) by 72 days.

(21) Appl. No.: 10/188,844

(22) Filed: Jul. 5, 2002

Related U.S. Application Data

(60) Provisional application No. 60/356,733, filed on Feb. 15, 2002.

(51) Int. Cl.[7] .................................................. H05K 7/14
(52) U.S. Cl. ...................................... 361/800; 361/752
(58) Field of Search ................................ 361/730, 732, 361/736, 752, 753, 756, 800, 801, 816, 818; 174/35 R, 51

(56) References Cited

U.S. PATENT DOCUMENTS

| | | | |
|---|---|---|---|
| 4,821,145 A | * 4/1989 | Corfits et al. ............. | 174/35 R |
| 4,864,077 A | * 9/1989 | Wadell ..................... | 174/35 R |
| 4,915,222 A | * 4/1990 | Reidinger et al. ......... | 174/35 R |
| 5,077,722 A | * 12/1991 | Geist et al. ................. | 360/137 |
| 5,737,194 A | * 4/1998 | Hopkins et al. ............ | 361/728 |
| 6,137,694 A | 10/2000 | Kerrigan et al. | |
| 6,163,454 A | 12/2000 | Strickler | |
| 6,269,008 B1 | 7/2001 | Hsu | |
| 6,284,970 B1 | * 9/2001 | Buskmiller et al. ..... | 174/35 GC |
| 6,327,155 B1 | * 12/2001 | Niepmann et al. .......... | 361/752 |
| 6,330,167 B1 | 12/2001 | Kobayashi | |
| 6,362,416 B1 | * 3/2002 | Denny et al. ........... | 174/35 GC |
| 6,421,252 B1 | * 7/2002 | White et al. ............... | 174/35 R |

* cited by examiner

Primary Examiner—David Martin
Assistant Examiner—Thanh S. Phan
(74) Attorney, Agent, or Firm—Patent & Trademark Services, Inc.; Joseph H. McGlynn

(57) ABSTRACT

Shielding for a blade server style computer wherein each individual blade is surrounded with shielding.

6 Claims, 2 Drawing Sheets

BLADE ARMOR SHIELDING

Applicant claims priority of Provisional Application Ser. No. 60/356,733, filed Feb. 15, 2002.

BACKGROUND OF THE INVENTION

This invention relates, in general, to shields, and, in particular, to shields for electrical devices.

DESCRIPTION OF THE PRIOR ART

In the prior art various types of devices have been proposed. For example, U.S. Pat. No. 6,163,454 to Strickler discloses a storage enclosure for electronic components with an EMI barrier.

U.S. Pat. No. 6,137,694 to Kerrigan et al discloses a computer chassis with a labyrinth seal at the front panel and the rear of the computer.

U.S. Pat. No. 6,330,167 to Kobayashi discloses an electromagnetic radiation shielding cap located over an electronic cartridge.

U.S. Pat. No. 6,269,008 to Hsu discloses an electromagnetic shield comprising a multi-walled cover with a gap between the inner and outer walls and a shielding gasket in the gap.

SUMMARY OF THE INVENTION

The present invention is directed to shielding for a blade server style computer wherein each individual blade is surrounded with shielding.

It is an object of the present invention to provide a new and improved shielding for a blade server style computer.

It is an object of the present invention to provide a new and improved shielding for a blade server style computer which protects against electrostatic discharge and EMI Interference.

It is an object of the present invention to provide a new and improved shielding for a blade server style computer which provides for a secure connection between the blades and the connectors which receive the blades, while at the same time making the blades easily and quickly removable.

These and other objects and advantages of the present invention will be fully apparent from the following description, when taken in connection with the annexed drawings.

DESCRIPTION OF THE PREFERRED EMBODIMENT

Figure 1:
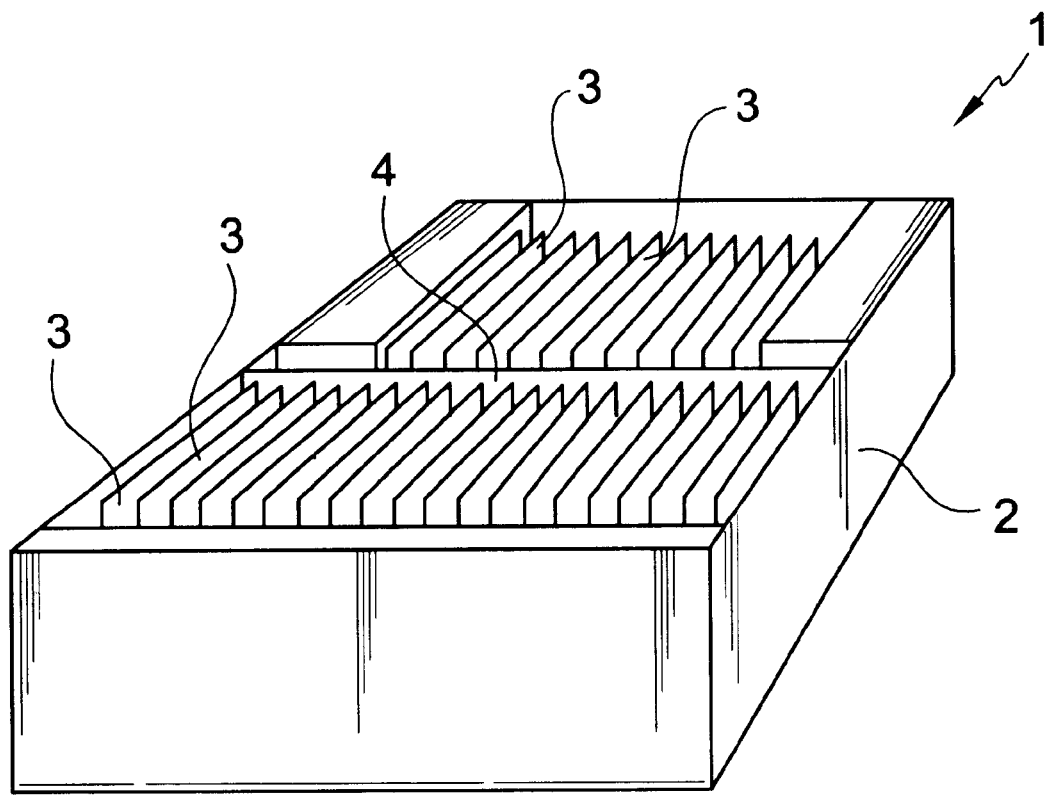
FIG. 1 is perspective view of a plurality of the blades of the present invention mounted within a computer enclosure.

Referring now to the drawings in greater detail, FIG. 1 shows a schematic view of the present invention 1 having a computer enclosure 2 with a plurality of the blades 3 mounted to a back plane 4 within the enclosure 2. It should be noted that FIG. 1 is not intended to show details of the blades of the present invention, but merely to show an overall view of the plurality of the blades with respect to the computer enclosure. It should be noted that the enclosure shown in FIG. 1 is a conventional enclosure in which a portion of the enclosure opens up so the blades can be installed and removed.

The present invention is designed to be used with blade style computers that contain a plurality of hot-swappable blades or printed circuit boards (PCB's). When the shielding of the present invention is installed onto each blade, the blades will be protected from electrostatic discharge (ESD) and will provide electromagnetic interference attenuation (EMI).

Each blade within the blade server contains expensive, yet sensitive electronic components. The blades are modular elements that are intended to be installed and removed while the rest of the system keeps running, i.e. hot-swapable. If left unprotected the blades can easily be damaged. The shielding of the present invention protects the electronic components by providing a metal shield around each individual blade, with only the mating contacts on the end of the blade exposed. These contacts are recessed within the shield to prevent any contact except from the contacts that will mate with them and which provide electrical communication with the computer. With the shielding of the present invention installed, the blades do not require any special handling, packaging or storage.

Figure 2:
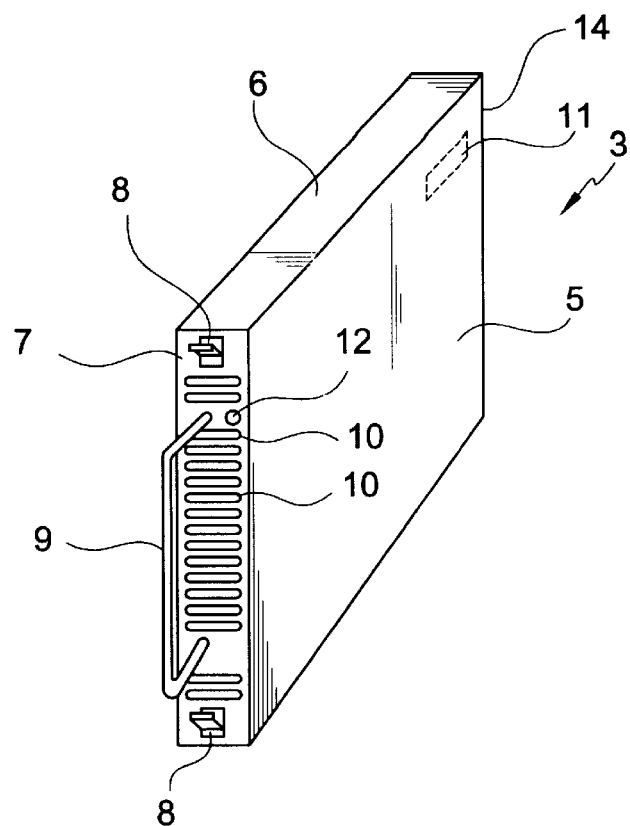
FIG. 2 is a perspective view of one of the blades of the present invention.

As shown in FIG. 2, each of the blades 3 has an enclosure comprising sides 5, edges 6 and ends 7, 10. The end 10 is open and houses recessed contacts 11, only one of which is shown in dotted lines in FIG. 2. The enclosure is made from a material that will suppress ESD and EMI interference, and since it surrounds each blade, the blade will be protected, whether connected to or removed from the computer. Also, the individual shielding allows hot-swapping of the blades, since the blades can be individually removed without losing any of the protective features of the shielding.

Figure 3:
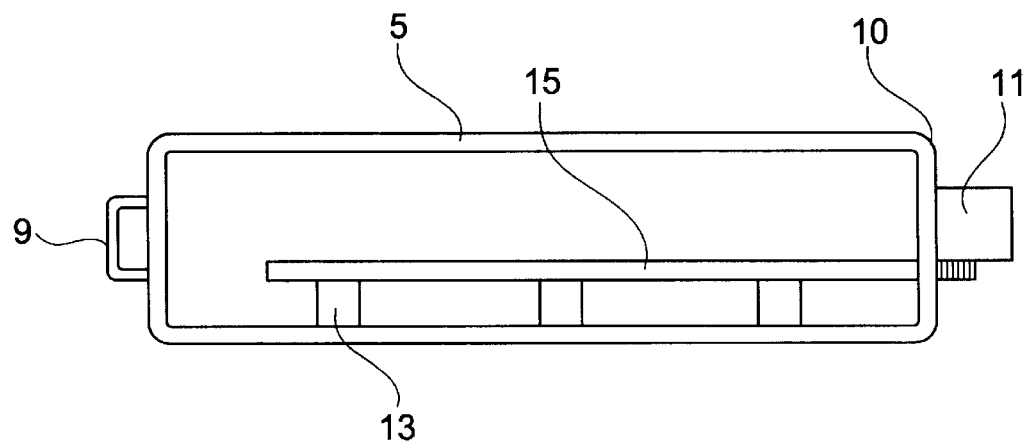
FIG. 3 is a side view of one of the blades of the present invention with a portion of the housing removed.

FIG. 3 shows one of the blades with a side removed to show the PCB 12 mounted inside the shielding. The PCB 12 is mounted on standoffs 13 in any conventional manner. The shielding can be made from any conventional metal or metallized plastic.

Each shield has, on the end 7, a pair of conventional latches 8 (see FIG. 2). The latches 8 will firmly secure the blades to their mating connectors, which are usually housed in the back plane 4 shown in FIG. 1. In addition, the end 7 has an indicator light 12 which will tell the user if the connectors have been properly mated. The apertures 10 are positioned to provide front to rear air flow across the electronic components within the housing. When used in conjunction with a back pane 4, which also allows air flow, the electronic components will be protect from damage due to heat. Thus the present design optimizes the number of blades which can be installed within a limited space.

In addition, the end 7 is provided with a handle 9 which will facilitate the insertion or removal of the blades from their mating connectors. The blades commonly have a plurality of contacts 11 will mate with corresponding contacts as the blades are inserted. The frictional forces between the mating contacts can be considerable because of the number of contacts involved. Also, pushing or pulling on the housing could damage the housing or the components within the housing. The handles are provided to avoid damage to these elements.

Although the Blade Armor Shielding and the method of using the same according to the present invention has been described in the foregoing specification with considerable details, it is to be understood that modifications may be made to the invention which do not exceed the scope of the appended claims and modified forms of the present invention done by others skilled in the art to which the invention pertains will be considered infringements of this invention when those modified forms fall within the claimed scope of this invention.

What I claim as my invention is:

1. A blade adapted to be used with a blade style server, said blade comprising:

a housing, said housing having sides, edges and ends, said entire housing being made from an electronic shielding material, one of said ends having means for handling said housing, and said one of said ends having means for securing said housing within said blade style computer, and said housing having at least one means for electronically communicating with said blade style server, said at least one means for electronically communicating with said blade style server comprising at least one contact.

2. The blade as claimed in claim 1, wherein said means for handling said housing comprises a handle, and said handle having a bottom section and two arms connected to said bottom section, said two arms being connected to said one of said ends.

3. The blade as claimed in claim 2, wherein said bottom of said handle has a longitudinal axis, and said one of said ends has a vertical axis, and said longitudinal axis is parallel with said vertical axis.

4. The blade as claimed in claim 1, wherein said means for electronically communicating with said blade style server is a printed circuit board.

5. The blade as claimed in claim 1, wherein said at least one contact is recessed within another of said ends of said housing.

6. The blade as claimed in claim 1, wherein said one of said ends has indicator means for indicating when said blade is properly connect to said blade style server.

* * * * *